US011122695B2

(12) United States Patent
Yi et al.

(10) Patent No.: US 11,122,695 B2
(45) Date of Patent: Sep. 14, 2021

(54) LED DISPLAY WITH QUICK MAINTENANCE STRUCTURE

(71) Applicant: Unilumin Group Co., Ltd., Guangdong (CN)

(72) Inventors: Hangfa Yi, Guangdong (CN); Kuang Yang, Guangdong (CN); Pinglin Zhao, Guangdong (CN)

(73) Assignee: UNILUMIN GROUP CO., LTD., Shenzhen (CN)

( * ) Notice: Subject to any disclaimer, the term of this patent is extended or adjusted under 35 U.S.C. 154(b) by 0 days.

(21) Appl. No.: 16/254,932

(22) Filed: Jan. 23, 2019

(65) Prior Publication Data
US 2019/0159349 A1 May 23, 2019

Related U.S. Application Data

(63) Continuation-in-part of application No. PCT/CN2017/109545, filed on Nov. 6, 2017.

(30) Foreign Application Priority Data

Jul. 17, 2017 (CN) .......................... 201710580947.8

(51) Int. Cl.
*H05K 5/00* (2006.01)
*H05K 5/02* (2006.01)
(Continued)

(52) U.S. Cl.
CPC ............. *H05K 5/0017* (2013.01); *G09F 9/33* (2013.01); *H05K 5/023* (2013.01); *H05K 5/0217* (2013.01); *H05K 5/0221* (2013.01); *H05K 5/03* (2013.01)

(58) Field of Classification Search
CPC ............ G06F 3/1446; G09G 2300/026; G09G 2300/023; H05K 5/0017; H05K 5/0217;
(Continued)

(56) References Cited

U.S. PATENT DOCUMENTS 5,914,698 A * 6/1999 Nicholson ............. G09F 9/3026
345/1.3
6,175,342 B1 * 1/2001 Nicholson ............... G06F 3/147
345/1.1
(Continued)

FOREIGN PATENT DOCUMENTS

CN 203038598 U 7/2013
CN 204332274 U 5/2015
(Continued)

OTHER PUBLICATIONS

Zheng, Jian, English Translation of CN 205016208, originally published Sep. 15, 2015 (Year: 2015).*
(Continued)

*Primary Examiner* — Rockshana D Chowdhury
*Assistant Examiner* — Douglas R Burtner
(74) *Attorney, Agent, or Firm* — Hauptman Ham, LLP

(57) ABSTRACT

An LED display is provided in the present disclosure. The LED display includes a casing frame and an LED module. The LED module is fixedly connected with the casing frame by a locking knob, chucks and magnets fitted with each other, and positioning holes and positioning posts fitted with each other. The LED display further includes protective covers, a support base, a power rear cover, and a system control box. The protective covers are connected with the casing frame by fitting the positioning posts with the positioning holes. The support base and the casing frame are connected by fitting the positioning posts with the positioning holes and by a quick fixation with screws. The power rear cover is mounted on the system control box by a latch-hinge to facilitate the assembly and disassembly of various portions of the LED display.

10 Claims, 4 Drawing Sheets

(51) Int. Cl.
*H05K 5/03* (2006.01)
*G09F 9/33* (2006.01)

(58) Field of Classification Search
CPC ........ H05K 5/0221; H05K 5/023; H05K 5/03; G09F 9/33
See application file for complete search history.

(56) References Cited

U.S. PATENT DOCUMENTS

| | | | | |
|---|---|---|---|---|
| 6,414,650 | B1* | 7/2002 | Nicholson | G06F 3/147 |
| | | | | 345/1.1 |
| 6,816,389 | B1* | 11/2004 | Lutz | H05K 5/0247 |
| | | | | 361/679.21 |
| 7,837,240 | B2* | 11/2010 | Chin | F16M 11/041 |
| | | | | 292/37 |
| 8,154,864 | B1* | 4/2012 | Nearman | G09F 9/3026 |
| | | | | 361/679.46 |
| 9,081,552 | B1* | 7/2015 | Hall | F21K 9/20 |
| 9,311,836 | B1* | 4/2016 | van der Walde | G09F 15/0018 |
| 9,990,869 | B1* | 6/2018 | Hall | G06F 3/1446 |
| 2011/0181495 | A1* | 7/2011 | Chu | G09F 9/33 |
| | | | | 345/1.3 |
| 2012/0224311 | A1* | 9/2012 | Sutherland | G06K 9/00335 |
| | | | | 361/679.01 |
| 2013/0010408 | A1* | 1/2013 | Lin | E05C 19/14 |
| | | | | 361/679.01 |
| 2013/0271973 | A1 | 10/2013 | Rycyna, III | |
| 2014/0247612 | A1* | 9/2014 | Hochman | G06F 3/1446 |
| | | | | 362/427 |
| 2016/0242302 | A1* | 8/2016 | Cox | F16B 2/06 |
| 2017/0003925 | A1* | 1/2017 | Cass | H05K 5/0256 |
| 2017/0006727 | A1* | 1/2017 | Ryu | G09F 9/33 |
| 2017/0031386 | A1* | 2/2017 | Engel | G06F 3/1446 |
| 2017/0105293 | A1* | 4/2017 | Kim | H05K 5/0221 |
| 2017/0127539 | A1 | 5/2017 | Drabant et al. | |
| 2017/0164487 | A1* | 6/2017 | Kim | G06F 1/1601 |
| 2017/0211786 | A1* | 7/2017 | Pan | F16B 21/09 |
| 2017/0249119 | A1* | 8/2017 | Ding | G06F 3/1446 |
| 2017/0359916 | A1* | 12/2017 | Hochman | H05K 7/1451 |
| 2018/0031919 | A1* | 2/2018 | Ryu | H01F 7/0252 |
| 2018/0063947 | A1* | 3/2018 | Tseng | H05K 1/16 |
| 2018/0075786 | A1* | 3/2018 | Thul | G06F 3/147 |
| 2018/0336805 | A1* | 11/2018 | Zolty | G09F 9/3026 |
| 2018/0374400 | A1* | 12/2018 | Cai | G09F 9/302 |
| 2019/0059166 | A1* | 2/2019 | Habeck | G09F 9/3026 |
| 2020/0090560 | A1* | 3/2020 | Dewaele | G09F 9/3026 |
| 2020/0097043 | A1* | 3/2020 | Kim | F16M 11/24 |
| 2020/0380895 | A1* | 12/2020 | Nakano | G09F 9/3026 |
| 2021/0004194 | A1* | 1/2021 | Wickstrum | H05K 5/0221 |

FOREIGN PATENT DOCUMENTS

| | | | |
|---|---|---|---|
| CN | 205016208 | * | 2/2016 |
| CN | 105427759 A | | 3/2016 |
| CN | 106782121 A | | 5/2017 |
| CN | 107134227 A | | 9/2017 |
| CN | 206726678 U | | 12/2017 |

OTHER PUBLICATIONS

International search report dated Apr. 16, 2018 from corresponding application No. PCT/CN2017/109545.
Extended European Search Report issued in European Application No. 17914118, dated Jan. 24, 2020, European Patent Office, Munich, Germany.

* cited by examiner (a) The locking knob is not in contact with the casing frame.

(b) The locking knob is in contact with the casing frame.

LED DISPLAY WITH QUICK MAINTENANCE STRUCTURE

CROSS-REFERENCE TO RELATED APPLICATION(S)

This application is a continuation-in-part of PCT/CN2017/109545, filed on Nov. 6, 2017, which claims priority to Chinese Patent Application No. 201710580947.8, filed on Jul. 17, 2017, the disclosure of which are hereby incorporated by reference in their entireties.

TECHNICAL FIELD

The disclosure relates to the technical field of display technologies, and more particularly to a light-emitting diode (LED) display.

BACKGROUND

With a rapid development of the LED display technology, LED displays are increasingly used in a variety of applications. The LED displays with high efficiency and excellent propaganda ability are increasingly applied to the stage design, commercial performances, exhibitions, and other industries. With the LED display technology yielding unusually brilliant results in the advertising field, the LED displays for sports stadium emerge at the right moment.

Currently. LED modules of outdoor LED displays for sports on the market are mostly fixed by screws, and it will take a long time to disassemble and assemble. In addition, the distinctions between the LED modules arranged on a left portion and a right portion, or on an upper portion and a lower portion of the LED display may lead to mis-assembly and take more time to assemble and maintain.

Therefore, existing LED displays for sports is very time consuming in the processes of assembling, disassembling, and maintaining.

SUMMARY

The technical problem to be solved in the present disclosure is to provide an LED display with convenience in assembly, disassembly, and maintenance.

To solve the above-mentioned technical problem, the present disclosure adopts a technical solution described as below.

An LED display including a casing frame and an LED module is provided, which further includes a locking knob. The locking knob is fixed on a rear side of the LED module. The locking knob is screwed and contacted with the casing frame, and the LED module is fixedly connected with the casing frame by the locking knob.

Beneficial effects of the present disclosure can be described as following. A quick connection between the casing frame and LED module of the LED display can be achieved by adopting the locking knob. That is, a connection between the casing frame and LED module of the LED display can be achieved by manually screwing the locking knob without accessory tools. Compared with traditional screw fastening methods, the LED display of the present disclosure allows for quicker easier disassembly and assembly of the LED display for the convenience in maintenance.

Figure 1:
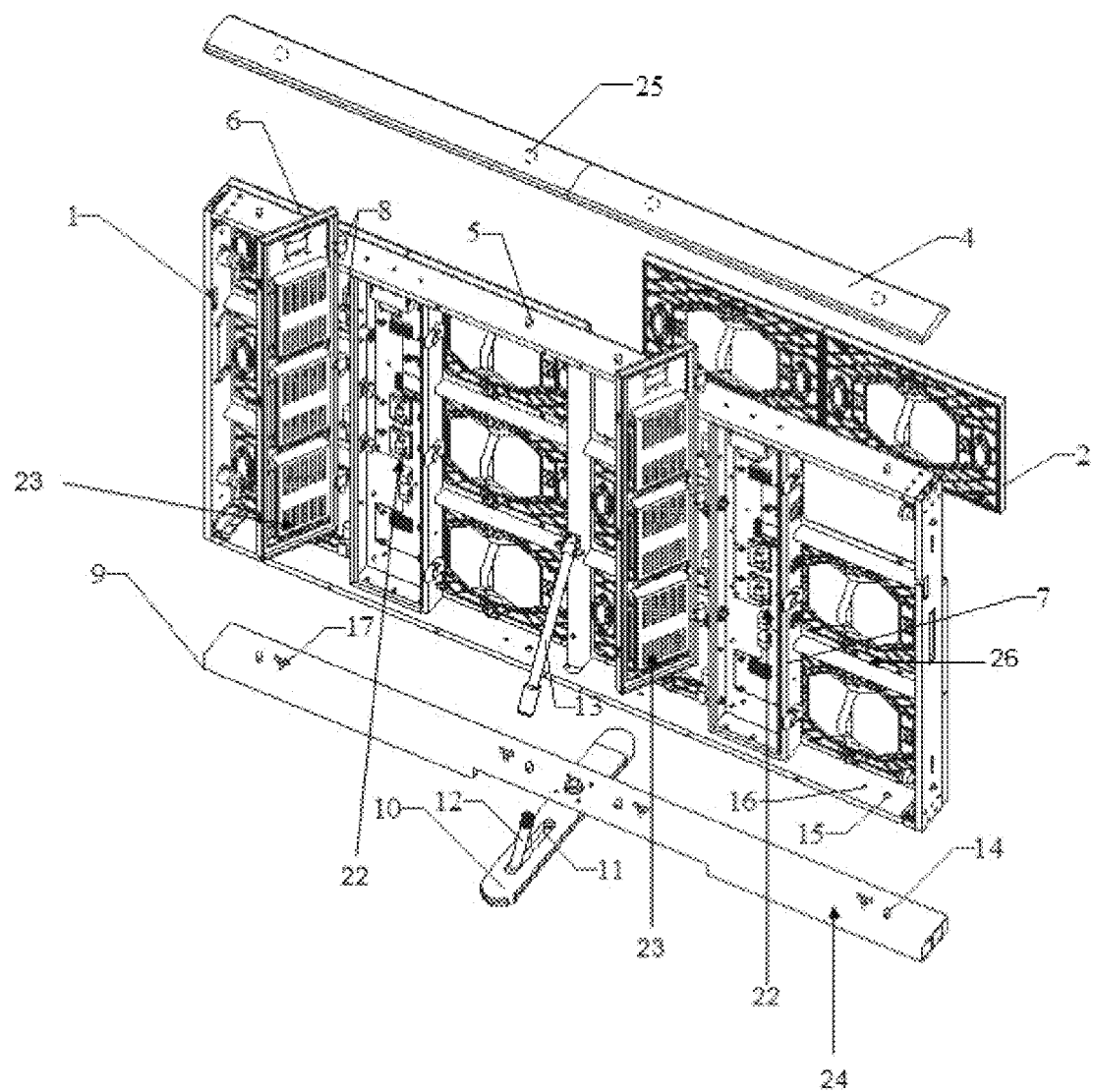
FIG. 1 is a schematic structural view illustrating an LED display according to an embodiment of the present disclosure.

The drawings are marked accordingly as follows:

| | | |
|---|---|---|
| 1. Casing frame | 2. LED module | 3. Locking knob |
| 4. Protective cover | 5. Second positioning post | 6. Power rear cover |
| 7. System control box | 8. Latch-hinge | 9. Base body |
| 10. Support plate | 11. Groove | 12. Second connection member |
| 13. First connection member | 14. First positioning post | 15. First positioning hole |
| 16. Via | 17. Screw | 18. Magnet |
| 19. Third positioning post | 20. Chuck | 21. Third positioning hole |
| 22. Backup receiver card | 23. Backup power supply | 24. Support base |
| 25. Second positioning hole | 26. Contact portion | |
| 301. Mounting plate | 302. Spring wire core | 303. Handle |
| 304. Lock cylinder | 305. Extension portion | 306. First circular piece |
| 307. Second circular piece | | |

DETAILED DESCRIPTION OF ILLUSTRATED EMBODIMENTS

Technical solutions, objectives, and effects achieved in the embodiments of the present disclosure will be described clearly and completely hereinafter with reference to the accompanying drawings in the embodiments of the present disclosure.

The technical solutions of the present disclosure include employing multiple locking knobs to realize a quick connection between the casing frame and the LED module of the LED display.

It should be understood that, relationships of orientations or positions indicated by terms such as "upper", "lower", "left", and "right" are based on that illustrated in the accompanying drawings according to the embodiments of the present disclosure, and merely to facilitate the description of the present disclosure and simplify the description rather than to suggest or indicate that devices or elements referred to must have particular orientations and be constructed and operated in particular orientations, and therefore is not to be construed as a limitation of the present disclosure. The terms such as "first" and "second" are used for distinguishing between different objects rather than describing a particular order.

Referring to FIG. 1 to FIG. 5, an LED display is provided. The LED display includes a casing frame 1, an LED module 2, and a locking knob 3. The locking knob 3 is fixed on a rear side of the LED module 2. The locking knob 3 is screwed and contacted with the casing frame 1, and the LED module 2 is fixedly connected with the casing frame 1 by the locking knob 3.

As can be seen from the above description, the quick connection between the casing frame 1 and the LED module 2 of the LED display can be achieved by adopting the locking knob 3. That is, a connection between the casing frame 1 and the LED module 2 of the LED display can be achieved by manually screwing the locking knob 3 without accessory tools. Compared with traditional screw fastening manners, the LED display of the present disclosure allows for quicker easier disassembly and assembly of the LED display for the convenience in maintenance.

Further, the locking knob 3 includes a mounting plate 301, a lock cylinder 304, a handle 303, and a spring wire core 302. The lock cylinder 304 is fixed to the LED module 2 by the mounting plate 301. The handle 303 is fixed at an end of the lock cylinder 304 away from the mounting plate 301. The spring wire core 302 is configured in a spiral shape, and has an end fixed in a portion of the lock cylinder 304 close to the handle 303 and another end wound around an end of the lock cylinder 304 close to the mounting plate 301.

As can be seen from the above description, the spring wire core 302 configured in the spiral shape has a continued maintenance of compression force during a rotation of the locking knob 3. When the locking knob 3 is tightened, a large tightness can be provided, thereby realizing a tight connection between the LED module 2 and the casing frame 1.

Further, a front side of the casing frame 1 is provided with chucks 20. The rear side of the LED module 2 is provided with magnets 18, and the magnets 18 are connected with the chucks 20 by the magnet attractive force.

As can be seen from the above description, the tightness of the connection between the casing frame 1 and the LED module 2 can be further improved by the chucks 20 disposed on the front side of the casing frame 1 and the magnets 18 disposed on the rear side of the LED module 2 connected with the chucks 20 by the magnet attractive force.

As an implementation of the present disclosure, the LED display further includes a system control box 7. The system control box 7 is fixed to the casing frame 1 and provided with a backup receiver card therein.

As can be seen from the above description, the system control box 7 is provided with the backup receiver card. The backup receiver card can be rapidly enabled to work when a receiver card fails. That is, a system backup can be achieved without re-installing the receiver card, which allows for easier maintenance of the LED display.

As an implementation of the present disclosure, the LED display further includes a power rear cover 6. The power rear cover 6 is mounted on the system control box 7 by a latch-hinge 8 and provided with a backup power supply.

As can be seen from the above description, the LED display is provided with the backup power supply. The backup power supply can be rapidly enabled to work when a power supply of the LED display fails. That is, a power supply backup can be achieved without re-installing the power supply, which allows for easier maintenance of the LED display. Furthermore, the power rear cover 6 is mounted on the system control box 7 by the latch-hinge 8. When replacing the power rear cover 6, the power rear cover 6 can be removed by unplugging power supply lines and lifting the power rear cover 6 up, and then a new power rear cover 6 can be installed, thereby allows for quicker maintenance of the LED display.

As an implementation of the present disclosure, the LED display further includes a support base. The support base includes a base body 9. A bottom portion of the casing frame 1 includes first positioning holes 15. The base body 9 is provided with first positioning posts 14. The first positioning holes 15 are fitted with the first positioning posts 14.

As can be seen from the above description, the fitness between the positioning holes 15 and the positioning posts 14 allows for easier disassembly and assembly of the support base.

Further, the rear side of the casing frame 1 is provided with a movable first connection member 13. The support base further includes a support plate 10. The support plate 10 is rotatably connected with a middle portion of the support base. The support plate 10 has a groove 11, and the groove 11 is provided with a movable second connection member 12 therein. The movable second connection member 12 is detachably connected with the movable first connection member 13.

As can be seen from the above description, the support plate 10 is configured to lie concealed within a structure of the support base. In use, the support plate 10 can be rotated to define an angle with the base body 9, and the second connection member 12 can be pulled out to connect with the first connection member 13 to realize a supporting effect for the LED display. When not in use, the second connection member 12 can be received into the groove 11, and the support plate 10 can be rotated to lie concealed within the structure of the support base, which is of great flexibility.

As an implementation of the present disclosure, the LED display further includes protective covers 4. A top portion of the casing frame 1 is provided with second positioning posts 5, and the protective covers 4 have second positioning holes 25 fitted with the second positioning posts 5.

As can be seen from the above description, the protective covers 4 are provided to prevent wires from being exposed and prolong a service life of the LED display. The protective covers 4 are connected with the top portion of the casing frame by fitting the second positioning posts 5 and the second positioning holes, which allows for quicker easier assembly and disassembly of the LED display.

Further, the second positioning posts 5, are positioned corresponding to and configured to be fitted with, the first positioning holes 15. As can be seen from the above description, the second positioning posts 5 are positioned corresponding to and configured to be fitted with the first positioning holes 15, which makes it convenient for extended applications of the LED display. The protective covers 4 and the support base can be quickly removed, which allows for tiling multiple LED displays, so as to be applied in more fields.

Further, the casing frame 1 includes multiple profiles spliced. As can be seen from the above description, the multiple profiles spliced of the casing frame 1 are adopted, such that the casing frame 1 can be light in weight with a stable structure and high strength, which is not easy to be deformed, and has a longer service life.

As a first embodiment of the present disclosure, referring to FIG. 1 to FIG. 5, an LED display is provided, which includes a casing frame 1 and multiple LED modules 2. The casing frame 1 can be configured in a grid structure as illustrated in FIG. 1. Each grid can be provided with one LED module 2 therein. The LED display further includes a locking knob 3 fixed on a rear side of the LED module 2. The locking knob 3 is screwed and contacted with the casing frame 1, so as to achieve a fixed connection between the LED module 2 and the casing frame 1.

The locking knob 3 includes a mounting plate 301, a lock cylinder 304, a handle 303, and a spring wire core 302. The middle portion of the mounting plate 301 is provided with an extension portion 305 extending upwardly perpendicular to the mounting plate 301. The extension portion 305 has a first end extending from the mounting plate 301 and a second end bending to oppose the mounting plate 301, and the extension portion 305 can be configured in an L-shape.

The lock cylinder 304 is fixed to the LED module 2 by the mounting plate 301. Each of two ends of the mounting plate 301 is provided with a hole, such that the lock cylinder 304 can be fixed to the LED module 2 by screws.

The lock cylinder 304 sequentially extends through the extension portion 305 and the mounting plate 301. A first circular piece 306 is provided at an end of the lock cylinder 304 close to the mounting plate 301 to fix the lock cylinder 304. Two circular holes of equal size are respectively provided in the extension portion 305 and the mounting plate 301, allowing the lock cylinder 304 to extend through. The diameters of the circular holes are slightly greater than that of the lock cylinder 304. The diameter of the first circular piece 306 is greater than that of the two circular holes. A second circular piece 307 can be provided between the first circular piece 306 and the mounting plate 301 as a gasket, and the diameter of the second circular piece 307 is greater than that of the first circular piece 306.

The handle 303 is fixed at an end of the lock cylinder 304 away from the mounting plate 301. A fixed connection of the handle 303 can be configured according to the practical needs. As one implementation, the lock cylinder 304 is provided with a via extending radially, and the handle 303 extends through the via. That is, the handle 303 can be fixed on the lock cylinder 304 by extending through the lock cylinder 304. As another implementation, the handle 303 can be integrated with the lock cylinder 304.

The spring wire core 302 is configured in a spiral shape. An end of the spring wire core 302 is fixedly connected with a portion of the lock cylinder 304 between the handle 303 and the extension portion 305. The via extending radially through the lock cylinder 304 can be provided, such that an end of the spring wire core 302 can extend through the lock cylinder 304 by the via. Another end of the spring wire core 302 is wound around an end of the lock cylinder 304 close to the mounting plate 301.

In one implementation, the end of the spring wire core 302 close to the handle 303 is disposed between the handle 303 and the second end of the extension portion 305, the another end of the spring wire core 302 close to the mounting plate 301 is disposed between the second end of the extension portion 305 and the mounting plate 301.

Further, the locking knob 3 further includes a contact portion, the contact portion is rotatable between the mounting plate 301 and the second end of the extension portion 305, and configured to be abutted against the casing frame 1. In one implementation of the present disclosure, the contact portion may be a part of the spring wire core 302, for example, the contact portion may be connected with the another end of the spring wire core 302 close to the mounting plate 301. In another implementation of the present disclosure, the contact portion may be an element fixed to the another end of the spring wire core 302 close to the mounting plate 301. When the handle 303 of the locking knob 3 is rotated, the lock cylinder 304 will be rotated together with the handle 303, and then the spring wire core 302 will be driven by the lock cylinder 304 to rotate between the mounting plate 301 and the second end of the extension portion, such that the contact portion can be rotated together with the spring wire core 302 between the mounting plate 301 and the second end of the extension portion 305.

Figure 2:
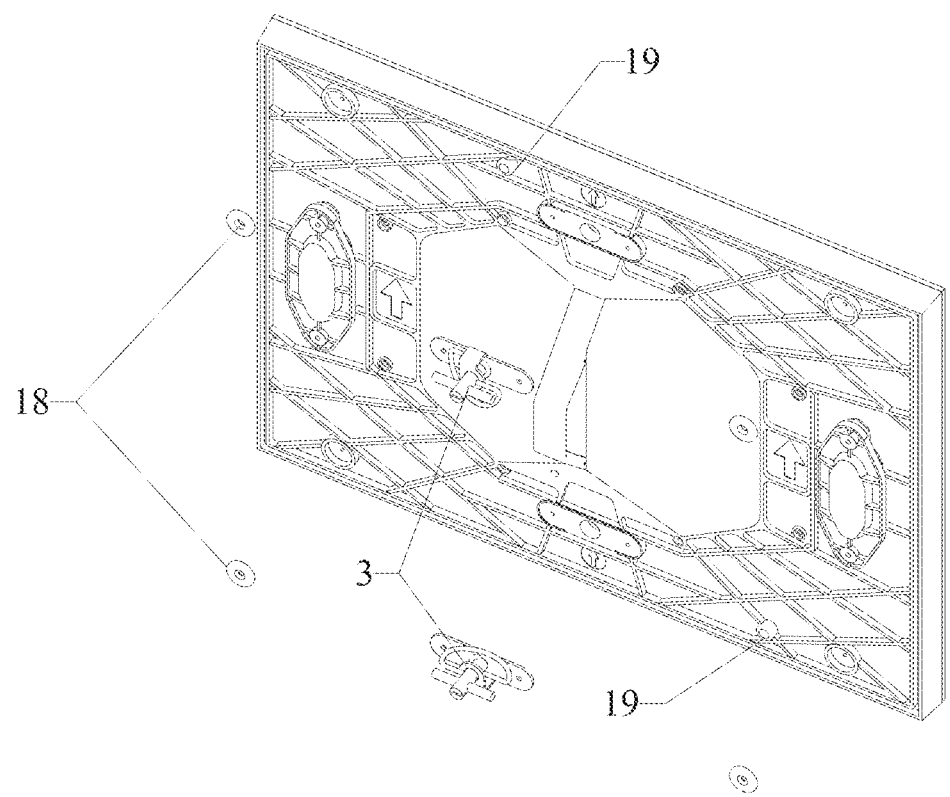
FIG. 2 is a schematic structural view illustrating an LED module according to an embodiment of the present disclosure.
Figure 3:
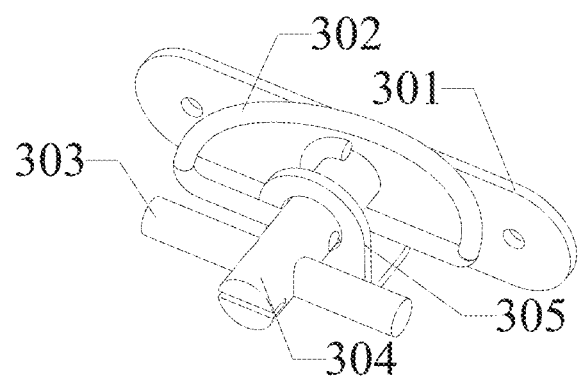
FIG. 3 is a schematic structural view illustrating a locking knob according to an embodiment of the present disclosure.
Figure 4:
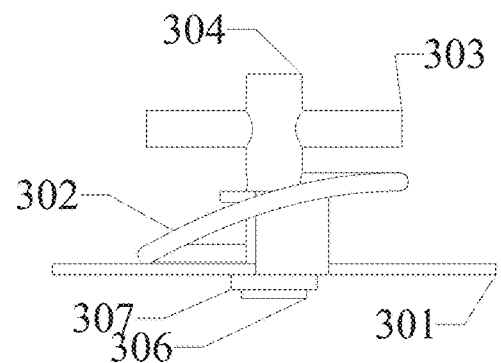
FIG. 4 is a schematic side view illustrating a locking knob according to an embodiment of the present disclosure.
Figure 6:
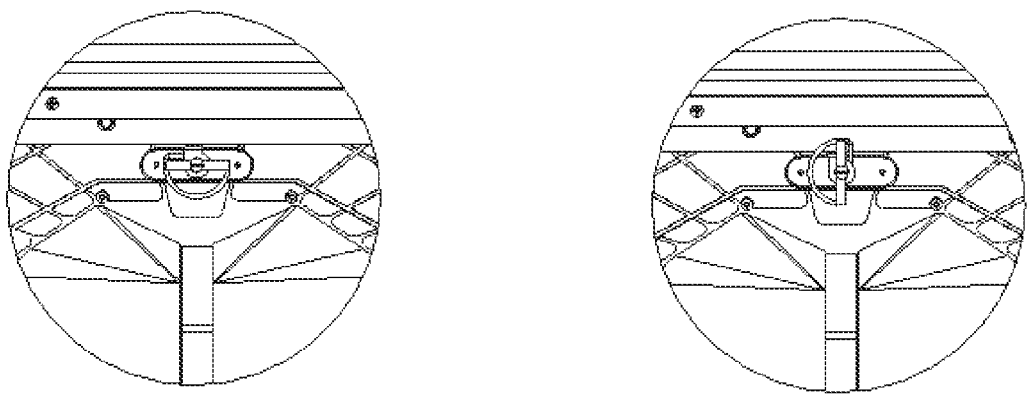
FIG. 6 is a schematic structural view illustrating a locking knob in an unlocked state and a locked state according to an embodiment of the present disclosure.

In one implementation, the number of locking knobs 3 can be set according to the practical needs. As illustrated in FIG. 2, one locking knob 3 can be provided on each of a top portion and a bottom portion of the LED module 2. The locking knob 3 can be rotated within 270 degrees. As illustrated in FIG. 6a, when the locking knob 3 is in an unlocked state, the spring wire core 302 of the locking knob 3 is not in contact with the casing frame 1 (that is, the contact portion of the spring wire core 302 is not in contact with the casing frame 1). As illustrated in FIG. 6b, when the locking knob 3 is rotated 270 degrees clockwise, the locking knob 3 is in contact with the casing frame 1 (that is, the contact portion of the spring wire core 302 is in contact with the casing frame 1), such that the LED module 2 is fixedly connected to the casing frame 1 and the LED module 2 will not fall outside.

It should be noted that, when the locking knob 3 is in the unlocking state, the contact portion of the locking knob 3 may be in contact with the mounting plate 301. When the contact portion of the locking knob 3 is rotated to be contact with and abutted against the casing frame 1, the locking knob 3 is in a locking state.

Figure 5:
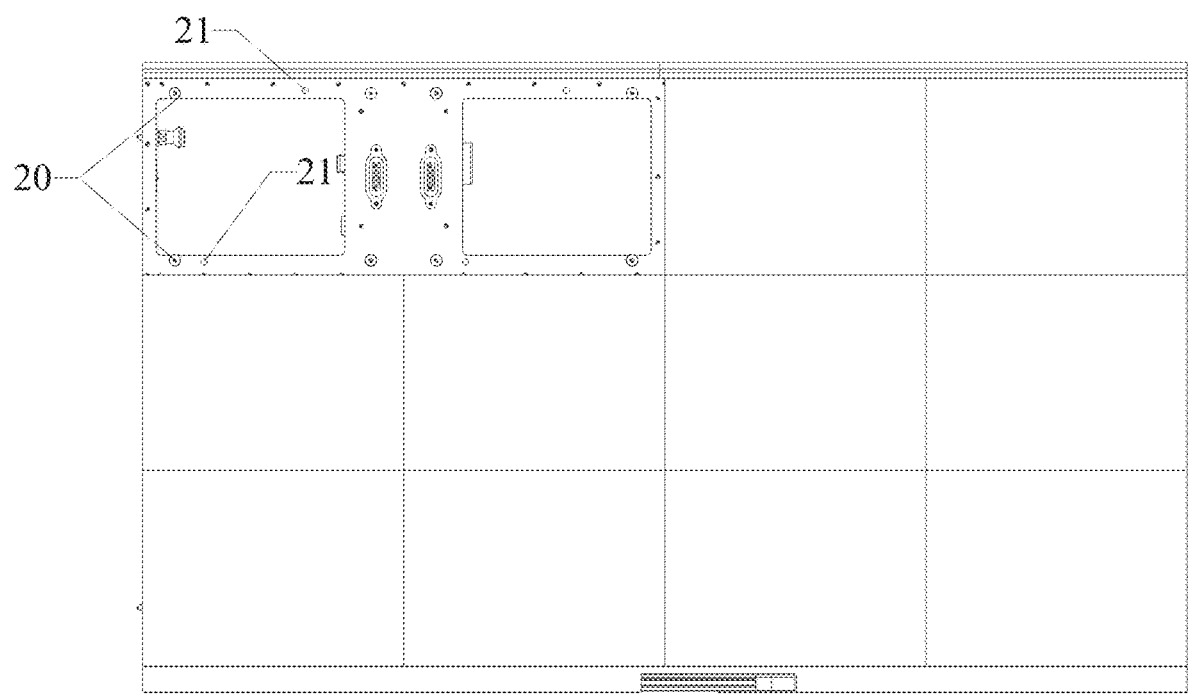
FIG. 5 is a schematic front view illustrating an LED display according to an embodiment of the present disclosure.

The front side of the casing frame 1 is provided with chucks 20. The rear side of the LED module 2 is provided with magnets 18. The magnets 18 are connected with the chucks 20 by the magnet attractive force. The number and positions of the chucks 20 can be set according to the practical needs. As illustrated in FIG. 5, one chuck 20 may be provided at each of the four corners of a frame corresponding to the LED module 2.

The front side of the casing frame 1 has third positioning holes 21. The rear side of the LED module 2 has third positioning posts fitting with the third positioning holes 21. The number and positions of the third positioning holes 21 can be set according to the practical needs. As illustrated in FIG. 5, two third positioning holes 21 may be provided at diagonal positions of the frame corresponding to the LED module 2.

To avoid a mis-assembly caused by distinctions between the LED modules arranged on a left portion and a right portion, or on an upper portion and a lower portion of the LED display, the LED modules are set as a uniform specification and can be arranged in any sequence without distinguishing between installation positions of upper, lower, left, and right.

As can be seen from the above description, a fixed connection between the LED module 2 and the casing frame 1 can be realized by the locking knob 3. The magnets 18 and the chucks 20, the positioning posts and the positioning holes fitted with each other are further provided between the LED module 2 and the casing frame 1. When the LED module 2 is assembled, the LED module 2 can be fixedly connected with the casing frame by manually screwing the locking knob 3. The LED module 2 can be pushed out forward to be disassembled by screwing the locking knob 3 to an unlocked state. In addition, since the LED modules are set as a uniform specification, the multiple LED modules can be arranged in any sequence without distinguishing between installation positions of upper, lower, left, and right. In such a structure, the LED display of the present disclosure allows for quicker easier disassembly and assembly of the LED display for the convenience in maintenance.

As a second embodiment of the present disclosure, referring to FIG. 1, an LED display is provided, which includes a casing frame 1, an LED module 2, a system control box 7, a power rear cover 6, a support base, and protective covers 4.

The casing frame 1 includes multiple profiles spliced. A bottom portion of the casing frame 1 includes first positioning holes 15 and vias 16. A top portion of the casing frame 1 is provided with second positioning posts 5. A rear side of the casing frame 1 is provided with a movable first connection member 13. The numbers and positions of the first positioning holes 15, the vias 16, and the second positioning posts 5 can be set according to the practical needs.

A rear side of the LED module 2 is provided with a locking knob 3. The locking knob 3 is screwed and contacted with the casing frame 1, such that the LED module 2 is fixedly connected with the casing frame 1 by the locking knob 3.

The system control box 7 is fixed to the casing frame 1 and provided with a backup receiver card, an adapter card, a protection switch, and an I/O connector therein.

The power rear cover 6 is mounted on the system control box 7 by a latch-hinge 8 and provided with a backup power supply and a liquid crystal display panel. The support base includes a base body 9 and a support plate 10. The base body 9 is provided with first positioning posts 14. The first positioning holes 15 are fitted with the first positioning posts 14.

To further improve the tightness of the connection between the support base and the casing frame 1, the base body 9 are provided with screw holes (not illustrated), and screws 17 fitted with the screw holes. The first positioning posts 14 are fitted with the first positioning holes 15 in the bottom portion of the casing frame 1. The screws 17 extend through the vias 16 and are fixed in the corresponding screw holes of the support base. The screws 17 have screw handles to facilitate the disassembly and assembly of the screws 17.

The support plate 10 is rotatably connected with the middle portion of the support base. As one implementation, a rotation angle of the support plate 10 relative to the support base is 90 degrees. The support plate 10 has a groove 11, and the groove 11 is provided with a movable second connection member 12 therein. The movable second connection member 12 is detachably connected with the movable first connection member 13, for example, by screw coupling.

Figure 7:
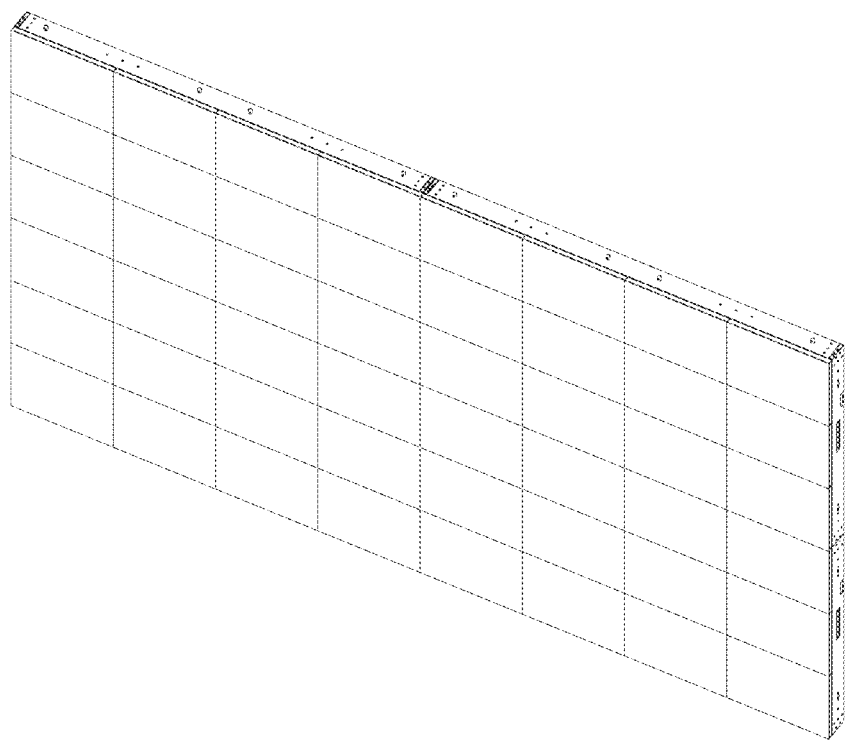
FIG. 7 is a schematic structural view illustrating multiple LED displays tiled according to an embodiment of the present disclosure.

The protective covers 4 have second positioning holes (not illustrated) fitted with the second positioning posts 5. The second positioning posts 5 are positioned corresponding to and configured to be fitted with the first positioning holes 15, which makes it convenient for extended applications of the LED display. As illustrated in FIG. 7, the protective covers 4 and the support base can be quickly removed, which allows for tiling the multiple LED displays, so as to be applied in more fields.

As can be seen from the above description, a fixed connection between the LED module and the casing frame can be realized by the locking knob. The protective covers and the casing frame can be connected by fitting the positioning posts with the positioning holes. The support base and the casing frame are connected by fitting the positioning posts with the positioning holes and by a quick fixation with screws. The power rear cover is mounted on the system control box by a latch-hinge to facilitate the assembly and disassembly of various portions of the LED display. In addition, the power rear cover is also provided with a backup power supply and a backup receiver card. When any one of a power supply and a receiver card of the LED display fails, a backup power supply or a backup receiver card can be enabled to work, so as to achieve an immediate maintenance of the LED display.

As a third embodiment of the present disclosure, referring to FIG. 1 to FIG. 7, an LED display is provided, which includes a casing frame 1, an LED module 2, a system control box 7, a power rear cover 6, a support base, and protective covers 4.

The casing frame 1 includes multiple profiles spliced. A bottom portion of the casing frame 1 includes first positioning holes 15 and vias 16. A top portion of the casing frame 1 is provided with second positioning posts 5. A rear side of the casing frame 1 is provided with a movable first connection member 13. A front side of the casing frame 1 is provided with chucks 20 and third positioning holes 21. A rear side of the LED module 2 is provided with a locking knob 3, magnets 18, and third positioning posts 19. The locking knob 3 is screwed and contacted with the casing frame 1. The LED module 2 is fixedly connected with the casing frame 1 by the locking knob 3. The magnets 18 are connected with the chucks 20 by the magnet attractive force. The third positioning posts 19 are fitted with the third positioning holes 21.

The system control box 7 is fixed to the casing frame 1 and provided with a backup receiver card, an adapter card, a protection switch, and an I/O connector therein. The power rear cover 6 is mounted on the system control box 7 by a latch-hinge 8 and provided with a backup power supply and a liquid crystal display panel. The support base includes a base body 9 and a support plate 10. The base body 9 is provided with first positioning posts 14. The first positioning holes 15 are fitted with the first positioning posts 14.

To further improve the tightness of the connection between the support base and the casing frame 1, the base body 9 are provided with screw holes (not illustrated), and screws 17 fitted with the screw holes. The first positioning posts 14 are fitted with the first positioning holes 15 in the bottom portion of the casing frame 1. The screws 17 extend through the vias 16 and are fixed in the corresponding screw holes of the support base. The screws 17 have screw handles to facilitate the disassembly and assembly of the screws 17.

The support plate 10 is rotatably connected with the middle portion of the support base. As one implementation, a rotation angle of the support plate 10 relative to the support base is 90 degrees. The support plate 10 has a groove 11, and a movable second connection member 12 is disposed inside the groove 11. The movable second connection member 12 is detachably connected with the movable first connection member 13, for example, by screw coupling.

The protective covers 4 have second positioning holes (not illustrated) fitted with the second positioning posts 5. The second positioning posts 5 are positioned corresponding to and configured to be fitted with the first positioning holes 15, which makes it convenient for extended applications of the LED display. As illustrated in FIG. 7, the protective covers 4 and the support base can be quickly removed, which allows for tiling the multiple LED displays, so as to be applied in more fields.

In summary, the LED display is provided in the present disclosure. A fixed connection between the LED module and the casing frame can be realized by the locking knob, chucks and magnets fitted with each other, and positioning posts and positioning holes fitted with each other. The protective covers and the casing frame can be connected by fitting the positioning posts with the positioning holes. The support base and the casing frame are connected by fitting the positioning posts with the positioning holes and by a quick fixation with screws. The power rear cover is mounted on the system control box by a latch-hinge to facilitate the assembly and disassembly of various portions of the LED display. In addition, the power rear cover is also provided with a backup power supply and a backup receiver card. When any one of a power supply and a receiver card of the LED display fails, a backup power supply or a backup receiver card can be enabled to work, so as to achieve an immediate maintenance of the LED display.

It is to be noted that, the LED module described in the embodiments of the disclosure is presented in the form of functional modules. The term "module" used in the present disclosure should be understood as the broadest meaning as possible, and an object for implementing functions defined by each "module" may be, for example, an integrated circuit (ASIC), a single circuit, a processor (shared, dedicated, or chipset) and a memory for executing one or more software or firmware programs, a combinational logic circuit, and/or other suitable components that can achieve the above described functions.

The above-mentioned embodiments are merely some embodiments of the present disclosure, the scope of the present disclosure is not limited thereto. All equivalent transformations of the description and the accompanying drawings of the present disclosure, or direct and indirect applications in the related technical field shall fall within the protection scope of the present disclosure.

What is claimed is:

1. An LED display, comprising a casing frame and an LED module, wherein the LED display further comprises
   a locking knob fixed on a rear side of the LED module, the locking knob being screwed and contacted with the casing frame, and the LED module being fixedly connected with the casing frame by the locking knob,
   a support base comprising a base body and a support plate, the support plate rotatably connected with a middle portion of the base body, the base body comprising a recess for receiving the support plate, the support plate being rotatable within the recess and having a groove provided with a movable second connection member therein,
   first positioning holes provided at a bottom of the casing frame,
   first positioning posts provided at the base body and fitted with the first positioning holes, and
   a movable first connection member provided at the rear side of the casing frame, the movable first connection member detachably connected with the movable second connection member.

2. The LED display of claim 1, wherein
   a front side of the casing frame is provided with chucks; and
   the rear side of the LED module is provided with magnets, the magnets being connected with the chucks by the magnet attractive force.

3. The LED display of claim 1, further comprising:
   a system control box, fixed to the casing frame and provided with a backup receiver card therein.

4. The LED display of claim 3, further comprising:
   a power rear cover, mounted on the system control box by a latch-hinge and provided with a backup power supply.

5. The LED display of claim 1, further comprising:
   protective covers;
   a top portion of the casing frame being provided with second positioning posts, and the protective covers having second positioning holes fitted with the second positioning posts.

6. The LED display of claim 5, wherein the second positioning posts are positioned corresponding to and configured to be fitted with first positioning holes of another LED display.

7. The LED display of claim 1, wherein the casing frame comprises a plurality of profiles spliced.

8. The LED display of claim 1, wherein the locking knob comprises:
   a mounting plate;
   a lock cylinder, fixed to the LED module by the mounting plate;
   a handle, fixed at an end of the lock cylinder away from the mounting plate; and
   a spring wire core, having an end fixed in a portion of the lock cylinder close to the handle and another end wound around an end of the lock cylinder close to the mounting plate, and configured in a spiral shape.

9. The LED display of claim 8, wherein the mounting plate is provided with an extension portion, the extension portion has a first end extending from the mounting plate and a second end opposite to the mounting plate, the lock cylinder sequentially extends through the second end of the extension portion and the mounting plate.

10. The LED display of claim 9, wherein the end of the spring wire core close to the handle is disposed between the handle and the second end of the extension portion, the another end of the spring wire core close to the mounting plate is disposed between the second end of the extension portion and the mounting plate.

* * * * *